United States Patent [19]

Hsieh

[11] Patent Number: 5,196,991
[45] Date of Patent: Mar. 23, 1993

[54] PORTABLE COMPUTER HAVING PIVOTABLE DETACHABLE COVER WITH DISPLAY

[76] Inventor: La-Fai Hsieh, P.O. Box 372, Hsin Chu, Taiwan

[21] Appl. No.: 763,667

[22] Filed: Sep. 13, 1991

[51] Int. Cl.$^5$ .......... H05K 7/10; H01R 4/52; E05C 1/12; G06F 1/00
[52] U.S. Cl. .......... 361/392; 361/380; 439/346; 292/159
[58] Field of Search .......... 364/708; 439/296, 299, 439/345, 346; 292/156, 157, 159, DIG. 69, 87; 361/380, 390, 391, 392, 393, 394, 395, 399

[56] References Cited

U.S. PATENT DOCUMENTS

| | | | |
|---|---|---|---|
| 1,179,712 | 4/1916 | Fournier | 292/156 |
| 1,979,560 | 11/1934 | Levine | 292/159 X |
| 3,865,097 | 2/1975 | Robinson | 292/DIG. 69 X |
| 4,547,006 | 10/1985 | Castanier | 292/159 X |
| 4,688,131 | 8/1987 | Noda et al. | 361/391 X |
| 4,802,210 | 1/1989 | Spencer et al. | 292/87 X |
| 5,030,128 | 7/1991 | Herron et al. | 364/708 X |
| 5,138,565 | 8/1992 | Satou | 364/708 |

FOREIGN PATENT DOCUMENTS 3930648  5/1990  Fed. Rep. of Germany ...... 361/390

OTHER PUBLICATIONS

"Removable Liquid Crystal Display for a Personal Computer", IBM Technical Disclosure Bulletin, vol. 29, No. 10, pp. 4273 and 4274, Mar. 1987.
"Removable Liquid Crystal Display Mounting System", IBM Technical Disclosure Bulletin, vol. 29, No. 10, pp. 4271 and 4272, Mar. 1987.
"ProSpeed 386 Modular Workstation" Catalog Brochure, Copyright 1986 NEC Home Electronics (U.S.A.) Inc.

Primary Examiner—Leo P. Picard
Assistant Examiner—Michael W. Phillips
Attorney, Agent, or Firm—Pro-Techtor International

[57] ABSTRACT

A portable computer comprising a mainframe which has an upper cover mounting seat fastened therein; an upper cover detachably pivotably fastened in the upper cover mounting seat by an elongated hook plate through hook joint; a disk holder detachably fastened in the mainframe for holding a floppy disk drive or a hard disk drive and retained in place by spring strips; a keyboard detachably fastened in the mainframe by screws; a hard disk drive fixedly fastened in the mainframe; and a battery holder fastened in the mainframe to hold a battery set for providing necessary working voltage to the mainframe.

4 Claims, 4 Drawing Sheets

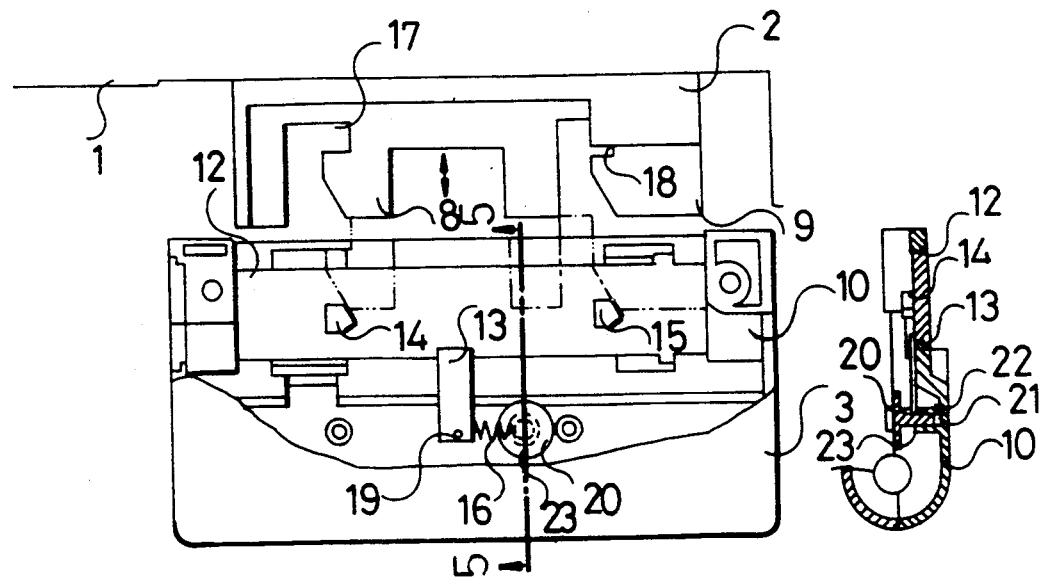
FIG. 3A
FIG. 5
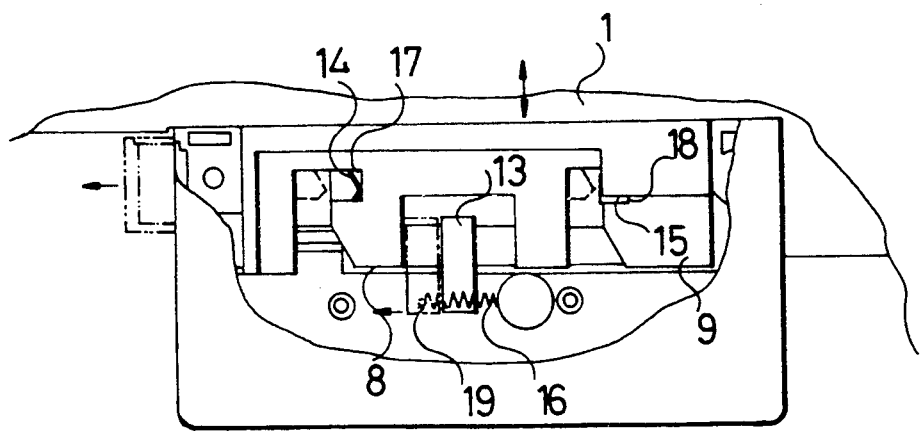
FIG. 3B

PORTABLE COMPUTER HAVING PIVOTABLE DETACHABLE COVER WITH DISPLAY

BACKGROUND OF THE INVENTION

The present invention relates to portable computers and relates more particularly to a portable computer which is compact and easy to operate.

The present invention provides an improvement on the portable computer disclosed in Chinese Patent Application Ser. No. 77,206,838. The portable computer as disclosed in Chinese Patent Application Ser. No. 77,206,838 provides several advantages including:

1. In addition to a fixed floppy disk drive, the mainframe has a hard disk drive adapter socket for fastening a hard disk drive;
2. A detachable battery case is attached to the mainframe at the back so that the computer can be operated outdoors;
3. The detachable battery case can be conveniently attached to the mainframe through bottom load by means of plug-in joint, which has a sliding block which will be firmly engaged into a retaining hole on the casing of the mainframe once it is set into position; and
4. The LCD display is fastened inside the upper cover which is detachable from the mainframe.

This structure of portable computer is still not satisfactory in use. One disadvantage of this structure of portable computer is that a hard disk drive is inconvenient to be fastened in the hard disk drive adapter socket. Another disadvantage of this structure of portable computer is that the battery case is not fixedly set inside the mainframe but shall be separately carried for ready use. Still another disadvantage of this structure of portable computer is that the upper cover fixing block must be removed from the mainframe so that the upper cover can be detached for replacement. Further, this structure of portable computer is relatively big and heavy.

SUMMARY OF THE INVENTION

The present invention has been accomplished to eliminate the aforesaid problems. It is therefore an object of the present invention to provide a portable computer which is light and compact.

It is another object of the present invention to provide a portable computer which has a battery holder fastened therein for holding batteries.

It is still another object of the present invention to provide a portable computer which can be conveniently detached and assembled.

According to the present invention, there is provided a portable computer which is generally comprised of an upper cover which has an LCD display fastened therein on the back side, a mainframe, a disk holder for holding a floppy disk or a hard disk alternatively, a hard disk fixedly fastened in said mainframe, a keyboard, and a battery holder for holding batteries. The upper cover is detachably pivotably fastened in an upper cover mounting seal on the mainframe by an elongated hook plate through hooked joint once it is inserted into position. The keyboard is replaceable fastened in the mainframe by screws. The disk holder is retained in place by a plurality of spring strips.

BRIEF DESCRIPTION OF THE DRAWINGS

The present invention will now be described by way of example only with reference to the annexed drawings, in which:

FIG. 3 are schematic plan views showing the connection of the elongated hook plate in the upper cover mounting seat.

DETAILED DESCRIPTION OF THE PREFERRED EMBODIMENT

Figure 1:
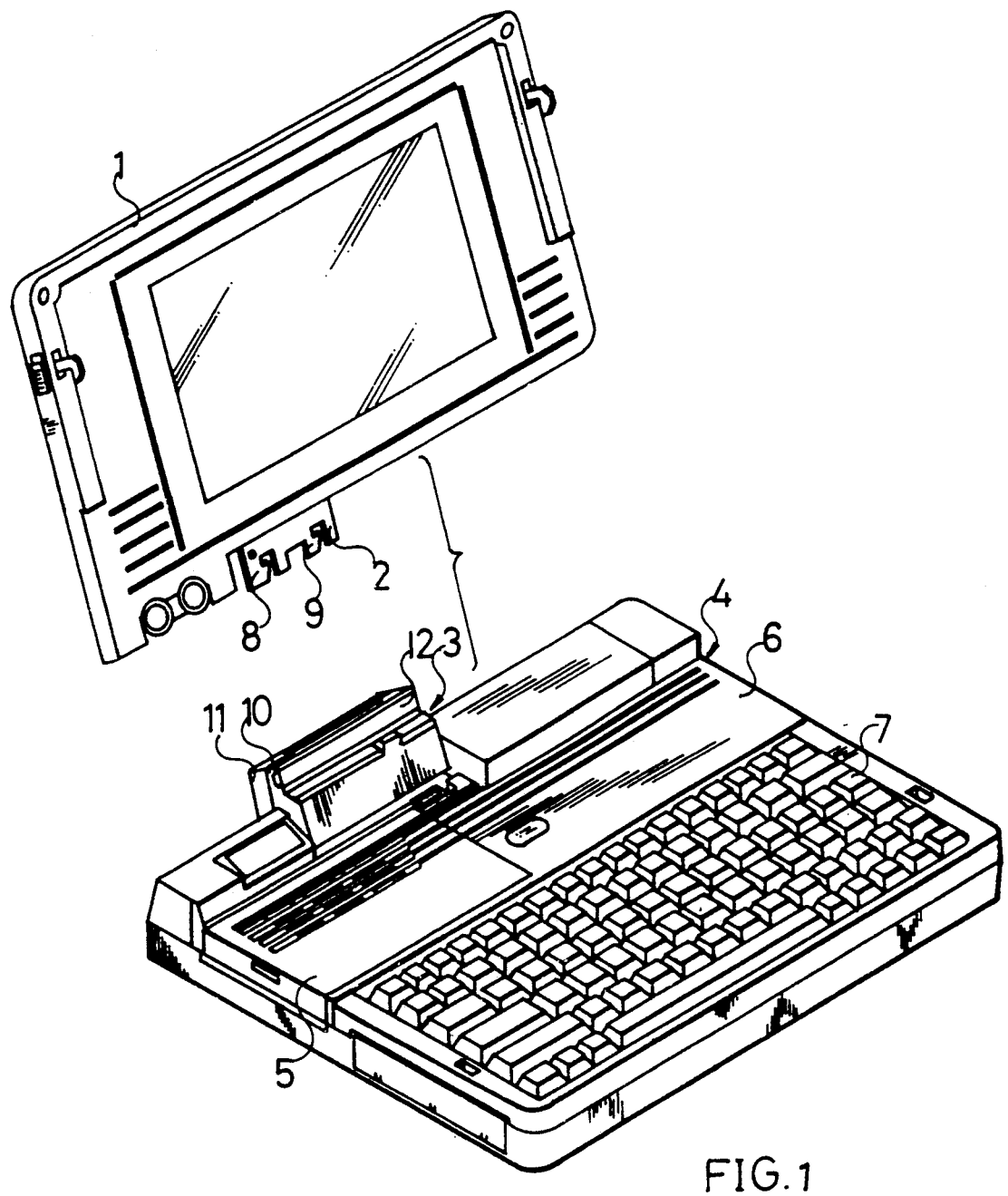
FIG. 1 is an elevational view of a portable computer embodying the present invention.

Referring to FIG. 1, a portable computer as constructed in accordance with the present invention is generally comprised of a rectangular upper cover 1, an elongated hook plate 2, an upper cover mounting seat 3, a mainframe 4, a disk holder 5, a hard disk drive 6, and a keyboard 7, wherein said elongated hook plate 2 has two hooked portions 8, 9 for securing said upper cover 1 to said upper cover mounting seat 3 which is fastened in said mainframe 4.

Figure 2:
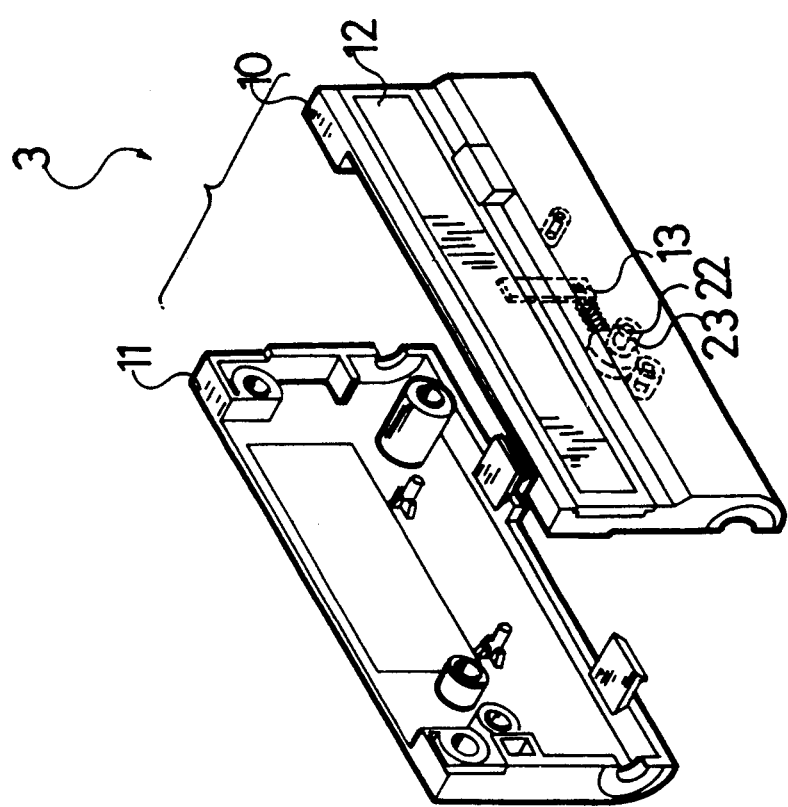
FIG. 2 is a dismantled perspective view of the upper cover mounting seat.

Referring to FIGS. 2 and 3, the upper cover mounting seat 3 is comprised of a front shell 10 and a rear shell 11. The front shell 10 has a movable plate 12 set therein at the front, an elongated rod 13 attached to said movable plate 12 at the middle, two retainer blocks 14, 15 made on said movable plate 12 at the back at two opposite locations, which two retainer blocks 14, 15 each has a retaining groove 17 or 18 made thereon, a circular rod 22 made thereon at the back adjacent to said elongated rod 13, which circular rod 22 has a hole 23 thereon, a circular plate 20 which has a stub rod 21 inserted in the hole 23 on said circular rod 22, and a spring 16 which has one end fastened in hole 19 on said elongated rod 13 and an opposite end secured to the stub rod 21 on said circular plate 20. When the elongated hook plate 2 which is hinged to the upper cover 1 is inserted in the upper cover mounting seat 3, the two hooked portions 8, 9 are automatically forced to respectively engage into the retaining grooves 17, 18 on the two retainer blocks 14, 15. When the movable plate 12 is moved in horizontal direction, the two retainer blocks 14, 15 are disconnected from the hooked portions 8, 9 and therefore, the upper cover 1 can be detached from the upper cover mounting seat 3.

Figure 4:
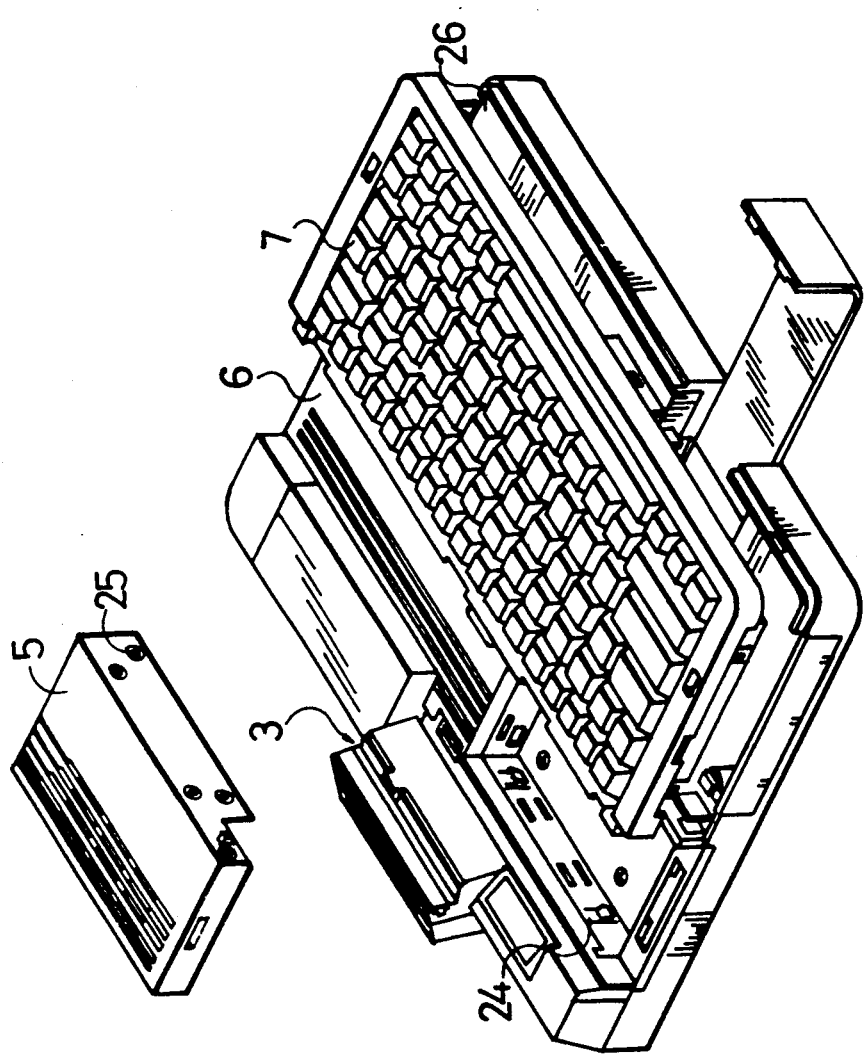
FIG. 4 is a dismantled perspective view of the disk holder, the keyboard, the battery holder and the mainframe.

Referring to FIG. 4, the disk holder 5, the hard disk drive 6 and the keyboard 7 are respectively fastened in the mainframe 4. The disk holder 5 which is provided for holding a floppy disk drive or hard disk drive alternatively has a plurality recessed holes 25 on the side surface thereof at suitable locations. The mainframe 4 has a plurality of spring strips 24 fastened therein at locations corresponding to the recessed holes 25 on the disk holder 5. Once the disk holder 5 is set into the mainframe 4, the spring strips 24 will be forced to automatically engage into the recessed holes 25 so as to secure the disk holder 5 in place. The mainframe 4 further comprises a rectangular battery holder 26 for holding batteries. The keyboard 7 is fastened in the mainframe 4 by screws. Therefore, different type of keyboard can be alternatively fastened in the mainframe 4 for different purpose.

As indicated, the present invention is to provide such a portable computer which is compact and generally comprised of an upper cover, a mainframe, a disk holder for holding a floppy or a hard disk drive, a hard disk drive, a keyboard and a battery holder for holding batteries, wherein the upper cover is detachably fastened in an upper cover mounting seat on the mainframe through hook joint; the keyboard is replaceable fastened in the mainframe by screws; the disk holder detachably retained in the mainframe by spring strips; the battery holder is fastened inside the mainframe for holding batteries which provide the mainframe with necessary working voltage.

What is claimed is:

1. A portable computer comprising a mainframe and an upper cover, said mainframe having a disk holder for alternatively holding a floppy disk drive or a hard disk drive, a hard disk drive and a keyboard, said upper cover being detachably pivotably fastened in an upper cover mounting seat on said mainframe by an elongated hook plate, said upper cover mounting seat comprising a movable plate, an elongated rod attached to said movable plate at the middle, two retainer blocks on said movable plate at two opposite locations, a stub rod fastened within said upper cover mounting seat, and a spring having one end fastened in a hole in said elongated rod and an opposite end secured to said stub rod, said elongated hook plate having two hooked portions extending from the bottom edge thereof at two opposite locations, wherein inserting said elongated hook plate into said upper cover mounting seat causes said two hooked portions to be engaged with said two retainer blocks; and moving said movable plate sidewards causes said two hooked portions to disconnect from said two retainer blocks.

2. The portable computer as set forth in claim 1, wherein said mainframe has a plurality of spring strips engaged in a plurality of recessed holes on said disk holder to firmly retain said disk holder in place when said disk holder is set in said mainframe.

3. The portable computer as set forth in claim 1, wherein said mainframe further comprises a rectangular battery holder with batteries within said battery holder to provide working voltage to said mainframe.

4. The portable computer as set forth in claim 1, wherein said keyboard is detachably fastened in said mainframe by screws.

* * * * *